United States Patent [19]

Shibata et al.

[11] Patent Number: 5,316,853
[45] Date of Patent: May 31, 1994

[54] EXPAND TAPE

[75] Inventors: Kazutaka Shibata; Yutaka Murakami, both of Kyoto, Japan

[73] Assignee: Rohm Co., Ltd., Kyoto, Japan

[21] Appl. No.: 816,398

[22] Filed: Dec. 27, 1991

[51] Int. Cl.⁵ .................. B32B 15/08; B32B 15/04
[52] U.S. Cl. ........................ 428/416; 428/418; 428/450; 428/473.5; 428/697; 428/913; 361/749; 361/807
[58] Field of Search ............ 428/416, 418, 450, 473.5, 428/697, 913

[56] References Cited

U.S. PATENT DOCUMENTS

| | | | |
|---|---|---|---|
| 4,626,474 | 12/1986 | Kim | 428/416 |
| 4,780,371 | 10/1988 | Joseph et al. | 428/416 |
| 4,847,136 | 7/1989 | Lo | 428/416 |
| 5,043,102 | 8/1991 | Chen et al. | 428/416 |

Primary Examiner—P. C. Sluby
Attorney, Agent, or Firm—Brumbaugh, Graves, Donohue & Raymond

[57] ABSTRACT

An expand tape used for dicing a semiconductor wafer includes an expandable film, and a preform layer which is provided on the expandable film and is used at die-bonding chips of the diced semiconductor wafer to a frame.

2 Claims, 2 Drawing Sheets

EXPAND TAPE

BACKGROUND OF THE INVENTION

The present invention relates to expand tapes for use at dicing of semiconductor wafers.

A semiconductor device is generally manufactured through a cutting process of cutting a semiconductor crystal into semiconductor wafers, a dicing process of dicing the semiconductor wafer into semiconductor chips, a die-bonding process of die-bonding the semiconductor chip to a package and so on.

When the semiconductor wafer is diced, an expand tape has conventionally been used. The expand tape is made of synthetic resin film which is expandable. At the dicing process, a wafer 14 is stuck onto a surface 11a of the expand tape as shown in FIG. 3(a). Under this state, the wafer 14 is diced (see FIG. 3(b)). When the expand tape 1 is expanded, the wafer 14 is separated into chips 15, 15, ..., 15 (see FIG. 3(c)). These chips 15 are then die-bonded onto lead frames, etc., using a preform material (e.g., a silver or solder paste) in the subsequent die-bonding process.

A dicing process using the aforesaid conventional expand tape is separated from a die-bonding process. Thus, semiconductor device manufacturing processes involve a greater number of steps and require more hands. Further, there is another problem that the handling of the preform material in addition to the expand tape is required.

SUMMARY OF THE INVENTION

The invention has been made in view of the above circumstances. Accordingly, an object of the present invention is to provide an expand tape with which the number of semiconductor manufacturing steps as well as burden on material handling can be reduced.

To achieve the above object, the expand tape of the present invention comprises a preform layer on an expandable film.

A wafer is diced into chips after being stuck onto the expand tape. Thereafter, when the chips are picked up from the expand tape, the preform material remains adhered onto the bottom of each chip. Therefore, the chip is ready to be die-bonded onto a lead frame, etc., immediately, thereby contributing to simplifying the steps and to decreasing hands. Further, the integration of the preform material with the expand tape allows material handling problem to be reduced.

DETAILED DESCRIPTION OF THE INVENTION

An embodiment of the invention will hereunder be described with reference to FIGS. 1 and 2.

Figure 1:
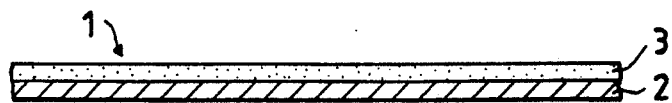
FIG. 1 is a sectional view showing the main portion of an expand tape, which is an embodiment of the invention.

FIG. 1 shows a section of an expand tape 1, which is the embodiment of the invention. This expand tape 1 is formed of an expandable synthetic resin film 2, and a preform layer 3 provided thereon. The shape of the expand tape may be circular. The preform layer 3 is formed by applying a conductive paste made of epoxy containing Ag or polyimide containing Ag, a solder paste made of Su-Pb, or a tape material made of Au-Si or Au-Ge to the synthetic resin film 2.

FIGS. 2(a) to 2(d) are diagrams sequentially showing a dicing process using the expand tape 1. First, a wafer 4 is adhered to the preform layer 3 of the expand tape 1 (see FIG. 2(a)). The adhesion is carried out using thermal effects or an adhesive layer of a thin adhesive sheet (not shown) fixed to the expand tape by a roller or coating. Then, the wafer 4 is cut into chips 5, ..., 5 using a dicing saw such as a thin circular diamond blade (not shown). The cutting is carried out by, for example, moving the dicing saw along the surface of the expand tape 1 from a portion on which the wafer is not adhered, through the wafer, to the other portion on which the wafer is not adhered. The depth of dicing grooves 6, ..., 6 reaches the film 2 so that the preform layer 3 can also be cut (see FIG. 2(b)).

Figure 2A:
FIGS. 2(a) to 2(d) are diagrams illustrative of a dicing process using the expand tape of the invention in sequence.
Figure 2B:
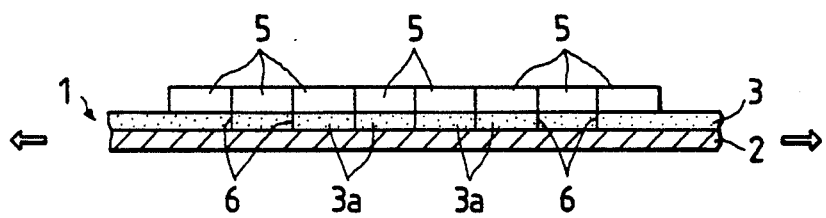
Figure 2C:
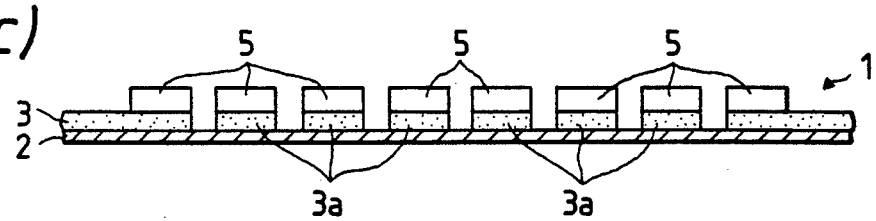

When tensile force is applied, for example, concentrically to the expand tape 1 to expand it under this state, the chips 5, ..., 5 are separated (see FIG. 2(c)). At the same time, the preform layer 3 are also separated into pieces 3a, ..., 3a together with the chips 5, ..., 5.

Figure 2D:
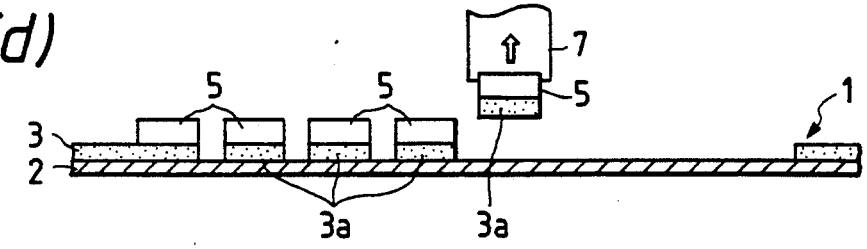
Figure 3A:
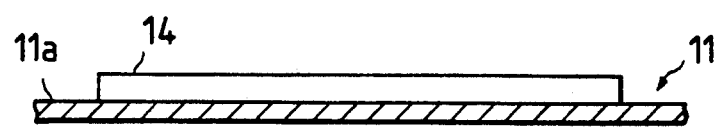
FIGS. 3(a) to 3(c) are diagrams illustrative of a dicing process using a conventional expand tape.
Figure 3B:
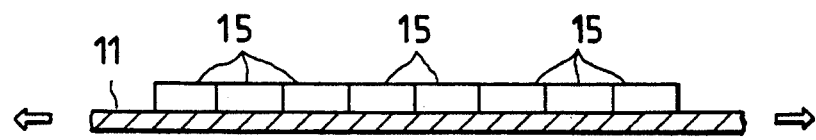
Figure 3C:
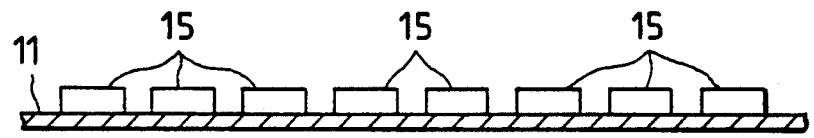

Each diced chip 5 is picked up by being adsorbed by a collet 7 as shown in FIG. 2(d). Since the piece 3a of the preform layer is adhered on the bottom of the chip 5, the chip 5 is ready to be die-bonded onto a lead frame, etc., immediately, thereby allowing the semiconductor manufacturing processes to be simplified.

As described in the foregoing, the expand tape of the present invention is formed of an expandable film and a preform layer provided thereon. As a result, not only the processes can be simplified and the hands involved in the processes can be decreased, but the burden on material handling can be reduced as well.

What is claimed is:

1. An expand tape for use at dicing of semiconductor wafers, comprising:
   an expandable synthetic resin film; and
   a preform layer provided on said expandable film.

2. An expand tape for use at dicing of semiconductor wafers comprising an expandable synthetic resin film and a preform layer provided on said expandable film, wherein said preform is formed of a material selected from a group consisting of conductive paste of epoxy containing silver, conductive paste of polyimide containing silver, solder paste of Su-Pb, a layer containing Au-Si and a layer containing Au-Ge.

* * * * *